(12) United States Patent
Abdennadher et al.

(10) Patent No.: US 6,777,921 B2
(45) Date of Patent: *Aug. 17, 2004

(54) ANALOG FILTER WITH BUILT-IN SELF TEST

(75) Inventors: Salem Abdennadher, Sacramento, CA (US); Hassan Ihs, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/062,180

(22) Filed: Jan. 30, 2002

(65) Prior Publication Data

US 2003/0141859 A1 Jul. 31, 2003

(Under 37 CFR 1.47)

(51) Int. Cl.[7] .................. G01R 23/16; G01R 23/165
(52) U.S. Cl. .................. 324/76.22; 324/76.45
(58) Field of Search .................. 324/76.22, 76.28, 324/76.29, 76.31, 613, 76.44, 76.47, 76.48, 76.45, 763, 765; 714/733, 724, 744, 740, 735; 333/165, 166, 167; 341/143

(56) References Cited

U.S. PATENT DOCUMENTS

| | | | |
|---|---|---|---|
| 5,923,676 A | | 7/1999 | Sunter et al. .............. 714/733 |
| 6,373,416 B1 | * | 4/2002 | McGrath .................. 341/143 |
| 6,408,412 B1 | * | 6/2002 | Rajsuman .................. 714/724 |
| 6,418,547 B1 | * | 7/2002 | Merritt .................... 714/744 |
| 6,448,754 B1 | * | 9/2002 | Ihs et al. ................ 324/76.22 |

* cited by examiner

Primary Examiner—Albert Decady
Assistant Examiner—James Kerveros
(74) Attorney, Agent, or Firm—Fish & Richardson P.C.

(57) ABSTRACT

An analog filter in an integrated circuit is tested by placing the filter in a feedback loop. The filter is tested by determining whether the analog filter, while in the feedback loop, provides a signal that oscillates within a predetermined tolerance of an expected frequency.

15 Claims, 3 Drawing Sheets

US 6,777,921 B2

ANALOG FILTER WITH BUILT-IN SELF TEST

BACKGROUND

This disclosure relates to analog filters with a built-in self-test.

Analog filters are commonly used in telecommunications and other applications. Such filters may form part of an integrated circuit. To assure that the filters meet design specifications, the integrated circuits may be subjected to testing during various stages of development and manufacturing. As a result of the increased complexity of integrated circuits and reduced access to internal circuit nodes, testing the filters in such integrated circuits occasionally results in significant delays during the development, production and maintenance of the integrated circuits.

DETAILED DESCRIPTION

Figure 1:
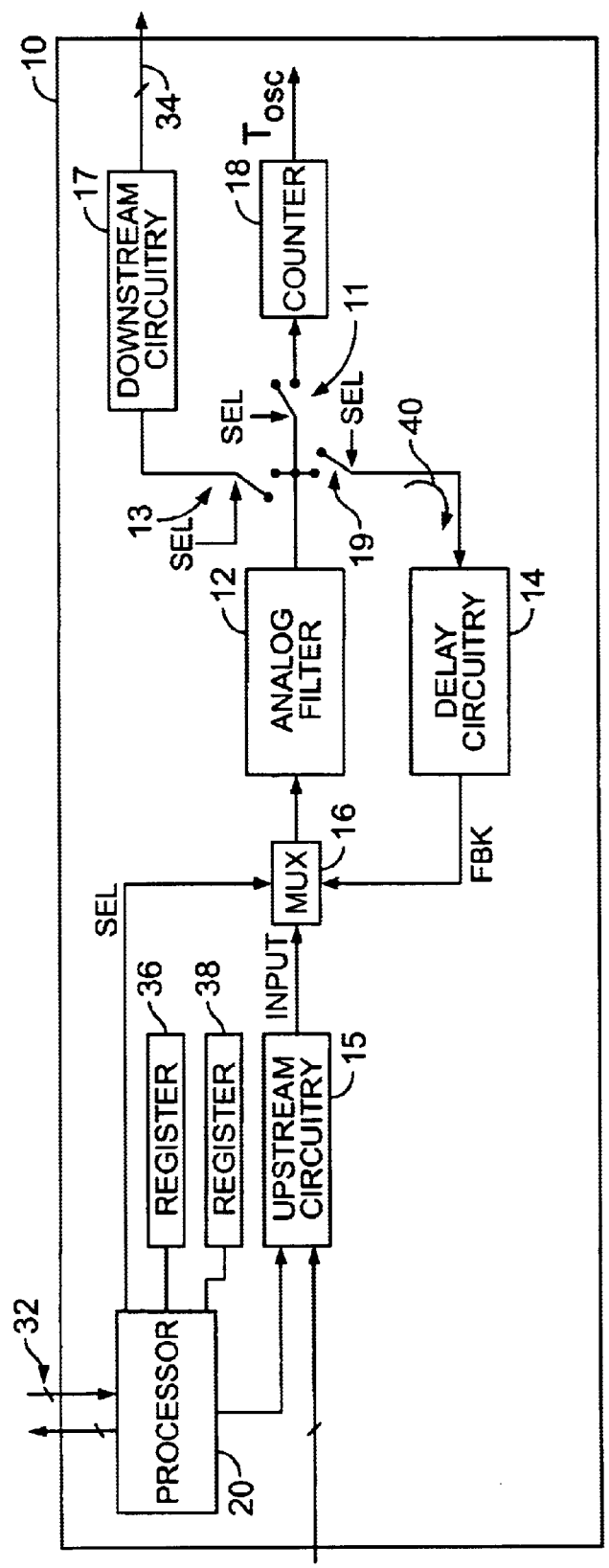
FIG. 1 is a block diagram of an integrated circuit with an analog filter.

Referring to FIG. 1, an integrated circuit 10 includes an analog filter 12 that may be used in either of two operating modes depending on the value of a control signal (SEL). The control signal (SEL) may be provided, for example, by a processor 20 in the integrated circuit 10. In one implementation, if the SEL control signal has a digital high value, the filter 12 operates in a first mode. Conversely, if the SEL control signal has a digital low value, the filter 12 operates in a second mode.

In one particular implementation, the filter 12 is part of a transceiver when operated in the first mode. In that first mode, a multiplexer or other switch 16 passes input signals from upstream circuitry 15 of the transceiver to the analog filter 12. The SEL signal causes a switch 13 to close to couple an output from the filter 12 to downstream circuitry 17 of the transceiver. The downstream circuitry 17 may be coupled to output lines 34 to allow signals from the integrated circuit 10 to be processed externally to the integrated circuit. In the first mode, the output of the filter 12 is disconnected from a counter 18 and from delay circuitry 14 by keeping switches 11, 19 open. The input to the delay circuitry 14, as well as other circuit components related to the built-in self test circuitry, may be coupled to ground to reduce power dissipation.

In the second, or test, mode, the filter 12 is coupled in a feedback loop 40 in the integrated circuit to allow the operation of the filter to be tested using a built-in self test technique. In the second mode, the SEL control signal causes switches 11, 19 to close so that the output of the filter 12 is coupled to the counter 18 and to the delay circuitry 14. An output signal (FBK) from the delay circuitry 14 is provided to the multiplexer 16, which in the second mode, allows the feedback signal to pass through to the filter. The delay circuitry 14 is designed so that if the filter is operating properly, coupling the filter 12 and the delay circuitry 14 in the feedback loop 40 will result in an oscillator circuit that oscillates at or about an expected frequency ($\omega_{exp}$). If the filter 12 is not operating properly, then either the circuit will not oscillate or the oscillation frequency will vary significantly from the expected frequency. Therefore, by placing the analog filter 12 into a feedback loop 40 designed to make the loop oscillate at a frequency close to the filter's cut-off frequency, the oscillating signal may be used as a test signature to determine whether the filter is operating as expected.

When the filter 12 is coupled to the delay circuitry 14 in the second mode of operation, the counter 18 measures the period ($T_{osc}$) of the oscillating signal. The counter 18 may include, for example, a negative comparator. To account for situations where the feedback loop 40 does not carry an oscillating signal, the counter stops counting if it reaches a predetermined maximum count. As explained below, the output from the counter 18 may be used to determine whether the filter is operating according to specifications.

Figure 2:
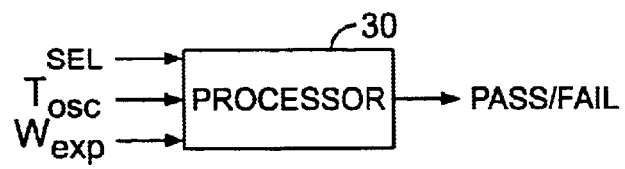
FIG. 2 illustrates input and output signals related to testing of the filter.

Referring to FIG. 2, a processor 30 receives signals corresponding to the oscillation frequency ($\omega_{osc}$) and the expected frequency ($\omega_{exp}$), as well as the SEL control signal. The frequency of oscillation ($\omega_{osc}$) may be calculated by the processor 30 from the measured period ($T_{osc}$). The processor 30 compares the frequency of oscillation ($\omega_{osc}$) to the expected frequency ($\omega_{exp}$) and provides an output signal (PASS/FAIL) indicating whether the difference in the frequencies, if any, is within predetermined tolerances of the expected frequency. The PASS/FAIL signal may indicate whether the analog filter 12 satisfies the design criteria for the filter's cut-off frequency.

The oscillation signal is processed by a processor that is external to the integrated circuit 10. Alternatively, a processor that resides in the integrated circuit 10, such as the processor 20 (FIG. 1), may process the oscillation signal to provide the PASS/FAIL signal. In one implementation, the processor 30 is a digital processor. In that case, the frequency $\omega_{exp}$, the period $T_{osc}$ and the PASS/FAIL signal may be represented by digital signals.

As discussed above, the delay circuitry 14 is designed to introduce a delay so that oscillation occurs at the expected frequency. For oscillation to occur in the closed loop circuit, the total phase of the loop should be about equal to zero modulo $2\pi$. The delay circuitry 14 is designed to add a phase to the expected phase of the filter 12 so that the total expected phase of the loop equals $2 n\pi$, where n is a positive integer.

Figure 3:
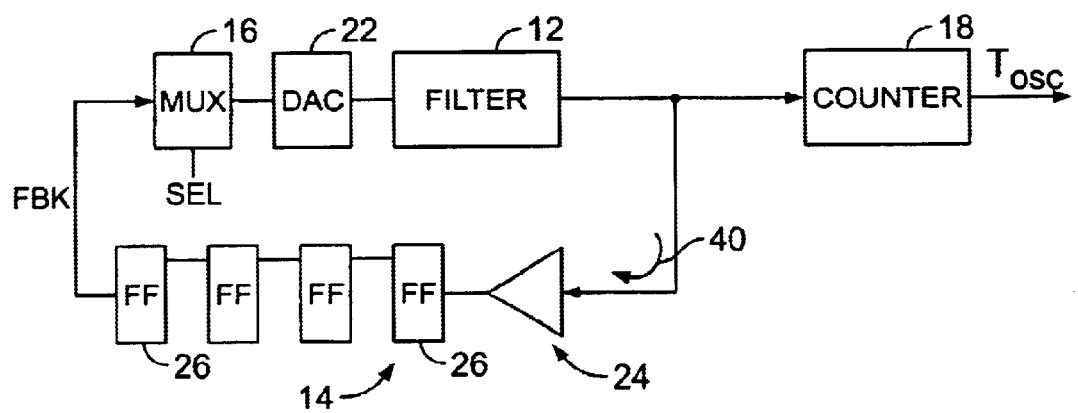
FIG. 3 shows details of a feedback loop for testing the analog filter.

Referring to FIG. 3, the delay circuitry 14 according to one particular implementation includes an inverter or other integrator 24. Preferably, an integrator that uses the same design technique as the analog filter 12 is used. That may help reduce phase variations introduced by process, temperature or power supply variations. For example, if the filter 12 uses a switched-capacitor RC technique, the same type of integrator should be included in the delay circuitry 14.

In addition to the inverter or integrator 24, one or more flip-flops 26 cascaded in series are provided in the feedback loop 40 to introduce the delay necessary to cause oscillation to occur at or close to the filter's cutoff frequency when the filter 12 is operating properly. The number of flip-flops may depend on the parameters to be matched with the oscillation frequency.

In the implementation illustrated in FIG. 3, the multiplexer 16 and the flip-flops 26 are digital components, whereas the filter 12 and the integrator 24 are analog components. A digital-to-analog converter (DAC) 22 is provided between the output of the cascaded flip-flops 26 and the input to the analog filter 12. Although the DAC is illustrated as positioned after the multiplexer 16, in other implementations it may be positioned in the feedback loop before the multiplexer.

Figure 4:
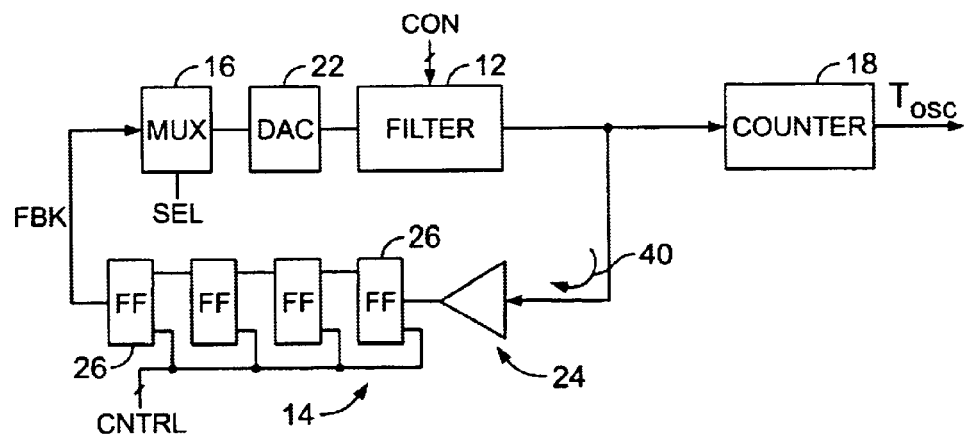
FIG. 4 shows details of another feedback loop for testing the analog filter.

Referring to FIG. 4, the feedback loop 40 includes a series of cascaded flip-flops that form an adjustable or programmable delay line. One or more control signals (CNTRL) are provided to control which flip-flops 26 are active and, thus, to adjust the desired delay. The control signals (CNTRL) are provided, for example, by the processor 20 (FIG. 1). Use of the adjustable delay line allows the filter 12 to be tested dynamically with different settings. During testing of the filter 12, the filter settings and the corresponding delays in the feedback loop 40 are adjusted automatically, so that the oscillation frequency for each setting may be tested in succession. The filter settings also may be established by control signals (CON) from the processor 20.

Figure 5:
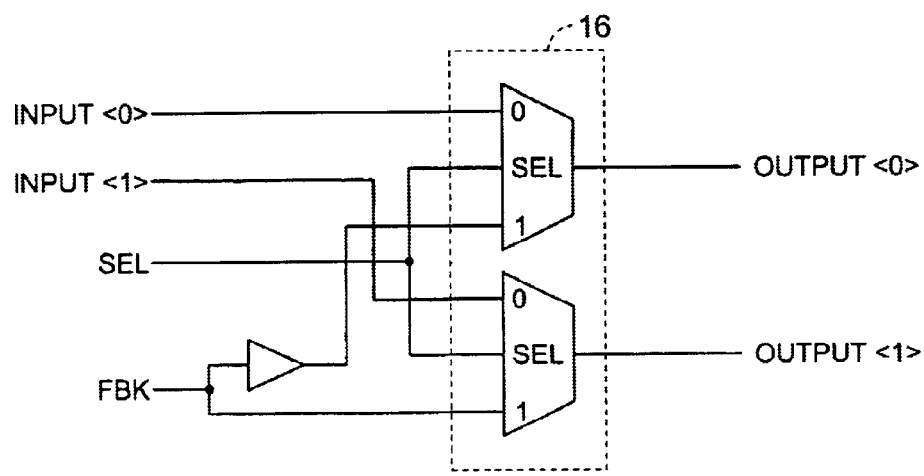
FIG. 5 illustrates an example of a multiplexer arrangement for use in the feedback loop.

FIG. 5 illustrates a schematic representation of a multiplexer 16 that switches the DAC 22 between two analog voltages, for example +1 and −1 volts, respectively. In this example, it is assumed that the processor 20 provides two digital input signals (INPUT<0>, INPUT<1>) to the multiplexer 16. The digital output signals from the multiplexer 16 are OUTPUT<0> and OUTPUT<1>, with logic values (10) and (01) corresponding, respectively, to the +1 and −1 voltage values. As shown in FIG. 5, the complement of the feedback signal (FBK) is used to provide two-bit complementary signals that switch the DAC 22 between the +1 and −1 voltage levels. Other implementations for the multiplexer 16 and DAC 22 may be used as well.

In general, the oscillation frequency ($\omega_{osc}$) and the cutoff frequency of the filter 12 may not have a linear relationship. The relationship between those frequencies, as well as the tolerance interval for the cutoff frequency, may be derived from circuit simulations or experimental techniques. The expected frequency ($\omega_{exp}$) corresponding to the filter's cut-off frequency may be stored, for example, as an eight-bit digital signal in a register 36 associated with the processor 20 (see FIG. 1). The predetermined tolerance(s) also may be stored in registers 38 associated with the processor 20.

To avoid damaging the filter 12 with excessively high input voltages, a voltage limiter (not shown) may be included in the feedback loop 40.

During manufacturing of the integrated circuit, the processor 20 may receive a signal over input/output lines 32 to cause the processor to place the filter 12 in the feedback loop 40 so that operation of the filter is tested automatically. The PASS/FAIL signal may be used to reject the integrated circuit if the PASS/FAIL signal indicates that the filter is not operating according to design specifications. For example, if the filter is tested at two different settings, the processor 20 may generate a signal indicating that the analog filter fails testing if it is determined that a first signal obtained from the feedback loop (using the first setting) does not oscillate within a predetermined tolerance of a first expected oscillation frequency or if it is determined that a second signal obtained from the feedback loop (using the second setting) does not oscillate within a predetermined tolerance of a second expected oscillation frequency. The signal indicating that the filter failed testing would be generated if either or both of those tests failed. Such testing may be performed at times other then during the manufacturing process as well.

In some applications, the analog filter 12 may be present in an architecture different from a transceiver architecture.

Using the built-in self-test technique provided by the feedback loop 40 in the integrated circuit may allow time-consuming analog signal digitizing and corresponding data processing techniques to be avoided. In some implementations, the use of digital components in the feedback loop may provide a relatively high tolerance to process and temperature fluctuations.

Other implementations are within the scope of the claims.

What is claimed is:

1. An integrated circuit comprising:

an analog filter;

delay circuitry; and switches coupled to the analog filter and delay circuitry to couple the analog filter and delay circuit in a feedback loop in response to a first state of a control signal;

a processor coupled to the switches to provide a control signal to the switches to couple the analog filter and the delay circuitry in a feedback loop during a test mode; and a counter that is coupled to an output of the analog filter to provide a signal indicative of whether the feedback loop carries an oscillating signal and indicative of an oscillation frequency if the feedback loop is carrying an oscillating signal.

2. The integrated circuit of claim 1 wherein the control signal is provided from a processor that is also configured to determine whether the oscillation frequency is within a predetermined tolerance of an expected frequency.

3. The integrated circuit of claim 1 comprising registers to store the expected frequency and predetermined tolerance.

4. The integrated circuit of claim 2 wherein the processor is configured to provide an output signal indicative of whether the oscillation frequency is within the predetermined tolerance of the expected frequency.

5. The integrated circuit of claim 1 wherein the processor is configured to determine whether the oscillation frequency is within a predetermined tolerance of an expected cut-off frequency of the analog filter and to provide an output signal indicative of whether the oscillation frequency is within the predetermined tolerance of the expected cut-off frequency.

6. The integrated circuit of claim 1 wherein the delay circuitry comprises an integrator.

7. The integrated circuit of claim 1 wherein the delay circuitry comprises:

an integrator; and a flip-flop in series with the integrator.

8. The integrated circuit of claim 7 wherein the delay circuitry includes flip-flops cascaded in series with one another.

9. The integrated circuit of claim 7 further comprising a digital-to-analog converter coupled between an output of the delay circuitry and an input to the analog filter.

10. The integrated circuit of claim 1 wherein the delay circuitry includes flip-flops cascaded in series with one another, and wherein the processor is configured to provide a control signal to select a setting of the analog filter and to provide a control signal to select which flip-flops are active.

11. An integrated circuit comprising:

an analog filter having adjustable settings;

delay circuitry having an adjustable delay; and a multiplexer;

a processor coupled to the multiplexer to provide a first control signal to the multiplexer to couple the analog filter and the delay circuitry in a feedback loop during a test mode, the processor coupled to the filter to provide a second control signal to select a setting of the filter and coupled to the delay circuitry to provide a third control signal to adjust an amount of delay of the delay circuitry; and a counter that is coupled to an output of the analog filter during the test mode to provide an output signal indicative of whether the feedback loop carries an oscillating signal and indicative of an oscillation frequency of the signal carried by the feedback loop if the feedback loop carries an oscillating signal, the processor coupled to receive the output signal from the counter and to provide a signal indicative of whether the oscillation frequency is within the predetermined tolerance of an expected frequency.

12. The integrated circuit of claim 11 wherein the delay circuitry includes flip-flops cascaded in series with one another.

13. The integrated circuit of claim 11 wherein the third control signal selects which of the flip-flops are active.

14. The integrated circuit of claim 13 wherein the delay circuitry further includes an integrator.

15. The integrated circuit of claim 11 further comprising a digital-to-analog converter coupled between an output of the delay circuitry and an input to the analog filter.

* * * * *